United States Patent
Eggleston et al.

(10) Patent No.: US 10,367,333 B2
(45) Date of Patent: Jul. 30, 2019

(54) INCREASING FABRY-PEROT CAVITY FREE SPECTRAL RANGE IN HYBRID LASERS

(71) Applicant: Alcatel-Lucent USA Inc., Murray Hill, NJ (US)

(72) Inventors: Michael S. Eggleston, Murray Hill, NJ (US); Guilhem de Valicourt, Murray Hill, NJ (US)

(73) Assignee: Nokia of America Corporation, Murray Hill, NJ (US)

(*) Notice: Subject to any disclaimer, the term of this patent is extended or adjusted under 35 U.S.C. 154(b) by 0 days.

(21) Appl. No.: 15/487,183

(22) Filed: Apr. 13, 2017

(65) Prior Publication Data

US 2018/0302167 A1   Oct. 18, 2018

(51) Int. Cl.
*H01S 3/13* (2006.01)
*H01S 5/14* (2006.01)
*H01S 5/10* (2006.01)

(52) U.S. Cl.
CPC ............ *H01S 5/142* (2013.01); *H01S 5/1092* (2013.01)

(58) Field of Classification Search
CPC .. H04B 10/503; H04S 5/0608; H04S 5/06821
See application file for complete search history.

(56) References Cited

U.S. PATENT DOCUMENTS

| 9,780,524 | B1* | 10/2017 | Zheng .................. H01S 5/0608 |
| 2004/0062483 | A1 | 4/2004 | Taghavi-Larigani et al. |
| 2005/0058396 | A1 | 3/2005 | Tormen et al. |
| 2008/0232409 | A1 | 9/2008 | Yamazaki |
| 2009/0122817 | A1 | 5/2009 | Sato et al. |
| 2009/0285251 | A1 | 11/2009 | Yamazaki |
| 2011/0058158 | A1* | 3/2011 | Heideman .......... G01N 21/6428 356/226 |
| 2015/0215043 | A1 | 7/2015 | Debregeas |
| 2015/0280403 | A1* | 10/2015 | Lin ..................... H01S 5/02252 359/341.1 |

(Continued)

FOREIGN PATENT DOCUMENTS

| EP | 167977 A2 | 7/2006 |
| EP | 1679771 A2 | 12/2006 |

(Continued)

OTHER PUBLICATIONS

Deki, Y. et al., "Wide-wavelength tunable lasers with 100 GHz FSR ring resonators", Electronics Letters, vol. 43, No. 4, Feb. 15, 2007, pp. 225-226.

(Continued)

*Primary Examiner* — Dzung D Tran
(74) *Attorney, Agent, or Firm* — Parker Justiss, P.C.

(57) ABSTRACT

An apparatus includes an optical amplifier waveguide and an optical reflector located to reflect back some light received at or near a first end of the optical amplifier waveguide. The apparatus also includes another optical waveguide having a first end located to receive light at or near a second end of the optical amplifier waveguide, and the another optical waveguide having a sequence of optical ring resonators optically connected there along with each of the optical ring resonators being configured to have a different free spectral range. A system and a method are also included.

23 Claims, 5 Drawing Sheets

RECONFIGURABLE OPTICAL COMB GRNERATOR

(56) References Cited

U.S. PATENT DOCUMENTS

| | | | |
|---|---|---|---|
| 2016/0204578 A1* | 7/2016 | Li | H01S 5/1032 |
| | | | 372/20 |
| 2017/0033870 A1* | 2/2017 | Dangui | H04B 10/43 |
| 2017/0040775 A1* | 2/2017 | Takabayashi | H01S 5/50 |

FOREIGN PATENT DOCUMENTS

| | | |
|---|---|---|
| EP | 1840631 A1 | 10/2007 |
| EP | 2597736 A1 | 5/2013 |
| WO | 2017131879 A1 | 8/2017 |
| WO | 2017131898 A1 | 8/2017 |

OTHER PUBLICATIONS

Fujioka, Nobuhide et al., "Compact and Low Power Consumption Hybrid Integrated Wavelength Tunable Laser Module Using Silicon Waveguide Resonators", Journal of Lightwave Technology, vol. 28, No. 21, Nov. 1, 2010, pp. 3115-3120.

Le Liepvre et al., "Widely Wavelength Tunable Hybrid III-V/Silicon Laser with 45 nm Tuning Range Fabricated Using a Wafer Bonding Technique", IEEE Internation Conference on Group IV Photonics (GFP) 2012, paper WC3, pp. 54-56.

Okamoto, T. et al., "A Compact Widely Wavelength-Tunable Laser Diode Monolithically Integrated With a Ring/MZI Loop-Filter", Semiconductor Laser Conference, IEEE 21st International, 2008, pp. 153-154.

Segawa, T. et al., "Semiconductor Double-Ring-Resonator-Coupled Tunable Laser for Wavelength Routing", IEEE Journal of Quantum Electronics, vol. 45, No. 7, Jul. 2009, pp. 892-899.

Todt, R. et al., "Widely tunable resonated-ring-reflector lasers covering C- and L-bands", European Conference on Optical Communications, 2007 (ECOC 2007), 2 pgs.

Dong, et al.; "Reconfigurable 100 Gb/s Silicon Photonic Network-on-Chip [Invited]"; vol. 7, No. 1, Jan. 2015; Opt. Commun. Netw. A37; Optical Society of America; 7 pgs.

Merghem, et al.; "Pulse generation at 346 GHz using a passively mode locked quantum-dash-based laser at 1.55 µm"; Applied Physics Letters 94, 021107; 2009; American Institute of Physics; 4 pgs.

Koch, et al.; "Mode-locked silicon evanescent lasers"; vol. 15, No. 18; Optics Express; Sep. 3, 2007; 9 pgs.

Srinivasan, et al.; "Harmonically Mode-Locked Hybrid Silicon Laser With Intra-Cavity Filter to Suppress Supermode Noise"; IEEE Journal of Selected Topics in Quantum Electronics, vol. 20, No. 4; http://www.ieee.org/publications_standards/publications/rights/index.html; Jul. 2014; 8 pgs.

Poette, et al.; "Highly-sensitive measurement technique of relative intensity noise and laser characterization"; The International Society for Optical Engineering; Jul. 2007; 11 pgs.

Gay, et al.; "Single Quantum Dash Mode-Locked Laser as a Comb-Generator in Four-Channel 112 Gbit/s WDM Transmission"; OFC, Tu2H.5; Optical Society of America; 2014; 3 pgs.

* cited by examiner

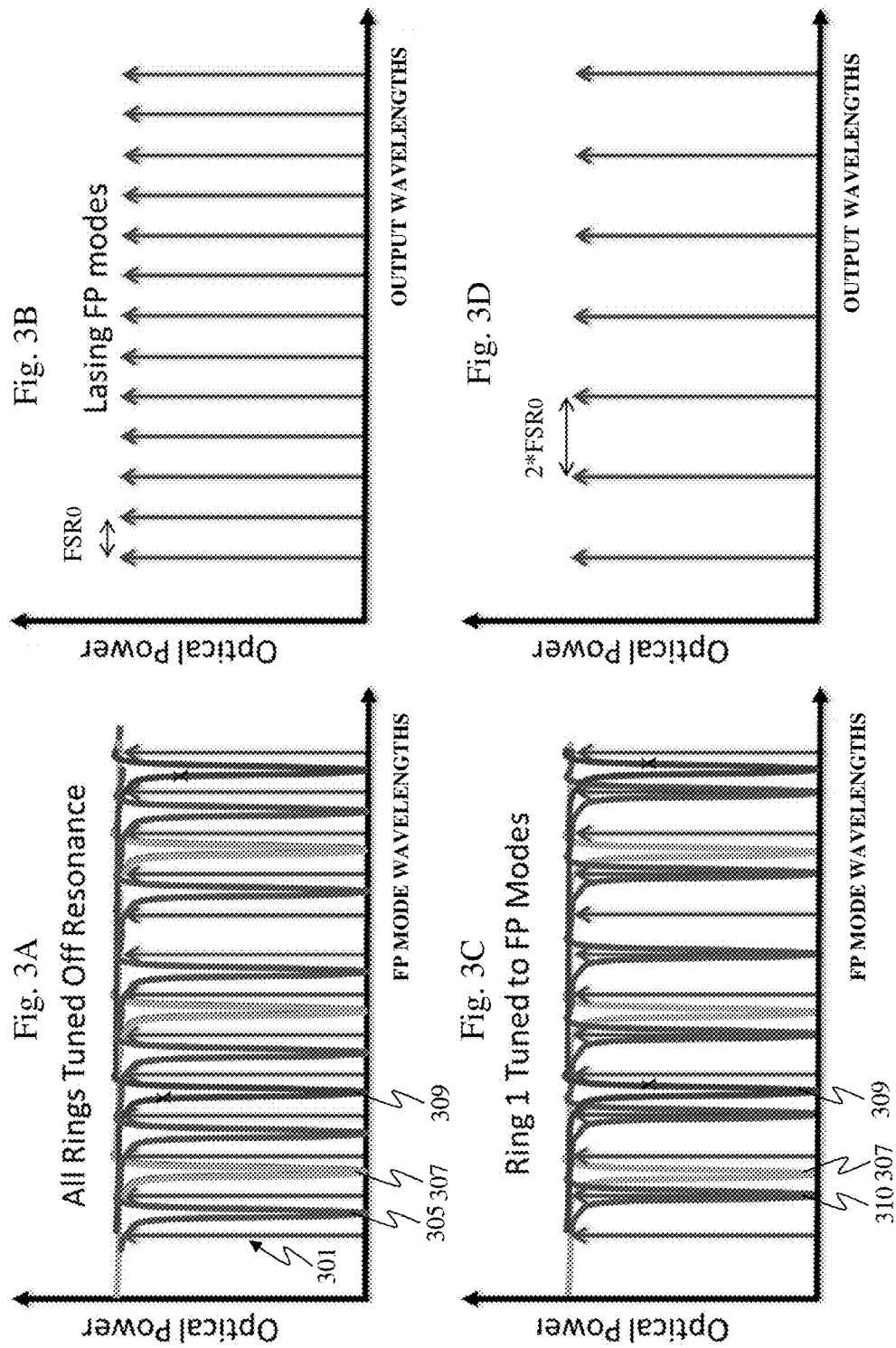

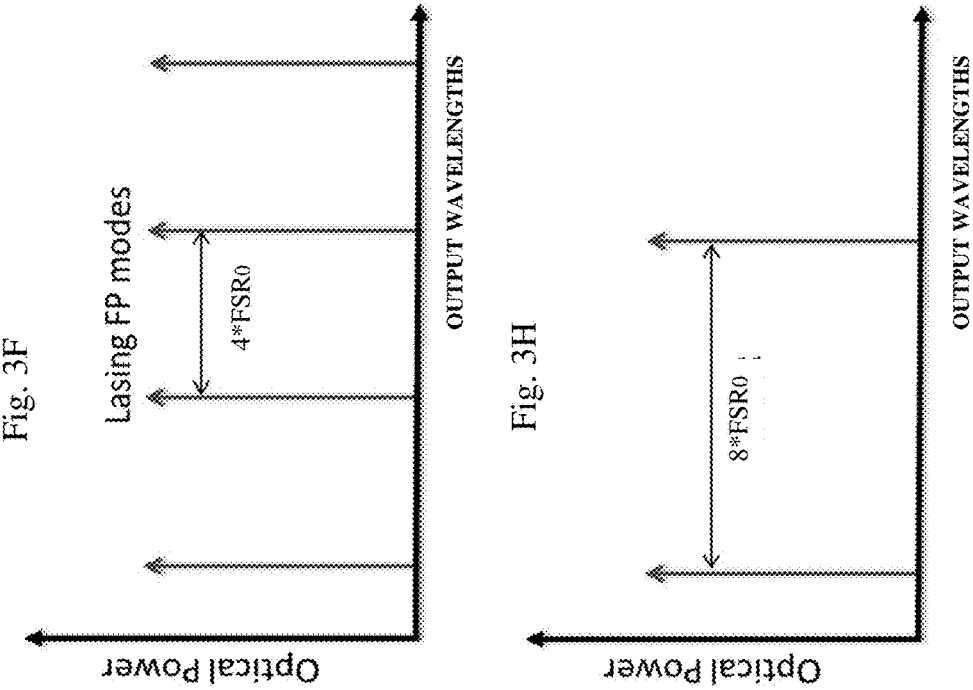
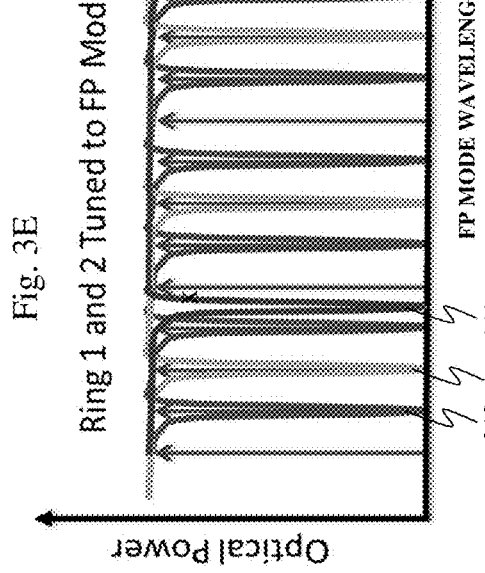
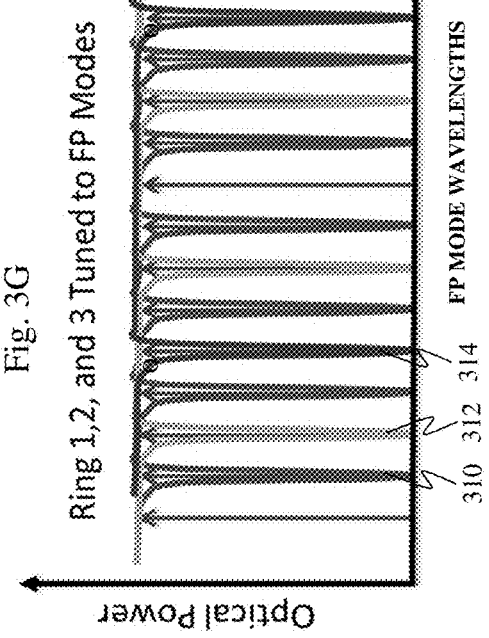

INCREASING FABRY-PEROT CAVITY FREE SPECTRAL RANGE IN HYBRID LASERS

TECHNICAL FIELD

This disclosure relates, in general, to optical communication systems and to the use and manufacturing of such systems.

BACKGROUND

The demands for network-on-chip applications continue to increase that require multi-frequency optical sources. Unfortunately, current multi-frequency optical sources suffer from low power per lasing wavelength, large linewidths (typically greater than one MHz), and difficulty in controlling the spacing between wavelengths. Typically, comb lasers are based on Fabry-Perot (FP) cavities, where the comb spacing free spectral range (FSR) is determined by a cavity length. To obtain high power and lower linewidth, longer cavities are required, which also decreases operating mode spacing. In addition, if hybrid lasers or external cavity lasers are required (e.g., for very narrow linewidth), the free spectral range may decrease to very small values, (e.g., less than 20 GHz). This becomes problematic since the free spectral range of a comb source determines the spacing between adjacent channels and the maximum modulation baud rate that it will accommodate. Therefore, to maintain an often desirable free spectral range, (e.g., greater than 40 GHz), current comb lasers are not typically capable of delivering high power per wavelength line with low enough wavelength linewidth.

SUMMARY

One embodiment is an apparatus. The apparatus includes an optical amplifier waveguide and an optical reflector located to reflect back some light received at or near a first end of the optical amplifier waveguide. The apparatus also includes another optical waveguide having a first end located to receive light at or near a second end of the optical amplifier waveguide, and the another optical waveguide having a sequence of optical ring resonators optically connected there along with each of the optical ring resonators being configured to have a different free spectral range.

Another embodiment is a system. The system includes a data modulator that provides transmission data and a reconfigurable optical comb generator that provides an output comb of optical wavelengths for an optical transmission of the transmission data. The reconfigurable optical comb generator includes an optical amplifier waveguide having an optical reflector located to reflect back some light received at or near a first end of the optical amplifier waveguide and another optical waveguide having a first end located to receive light and optically end-coupled to a second end of the optical amplifier waveguide. The another optical waveguide has a sequence of optical ring resonators optically connected there along with each of the optical ring resonators being configured to have a different free spectral range. The system also includes another optical reflector located to reflect light received at or near a second end of the another optical waveguide to form a laser cavity between optical reflectors, a data demodulator that recovers the transmission data from the optical transmission and a wavelength controller that controls the free spectral ranges of the optical ring resonators.

Yet another embodiment is a method. The method includes fabricating an optical amplifier waveguide having a first optical reflector located to reflect back some light received at or near a first end of the optical amplifier waveguide. The method also includes fabricating another optical waveguide having a first end located to receive light at or near a second end of the optical amplifier waveguide and having a second optical reflector located to reflect light back at or near a second end of the another optical waveguide to form a laser cavity between the first and second optical reflectors. The method additionally includes constructing optical ring resonators along the another optical waveguide that modify a free spectral range of an output comb of optical wavelengths.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

The embodiments of the disclosure are best understood from the following detailed description, when read with the accompanying Figures. Reference is now made to the following descriptions taken in conjunction with the accompanying drawings, in which:

FIGS. 3A-3H illustrate pairs of selectable optical filter operating conditions constructed according to the principles of the present disclosure.

Figure 1:
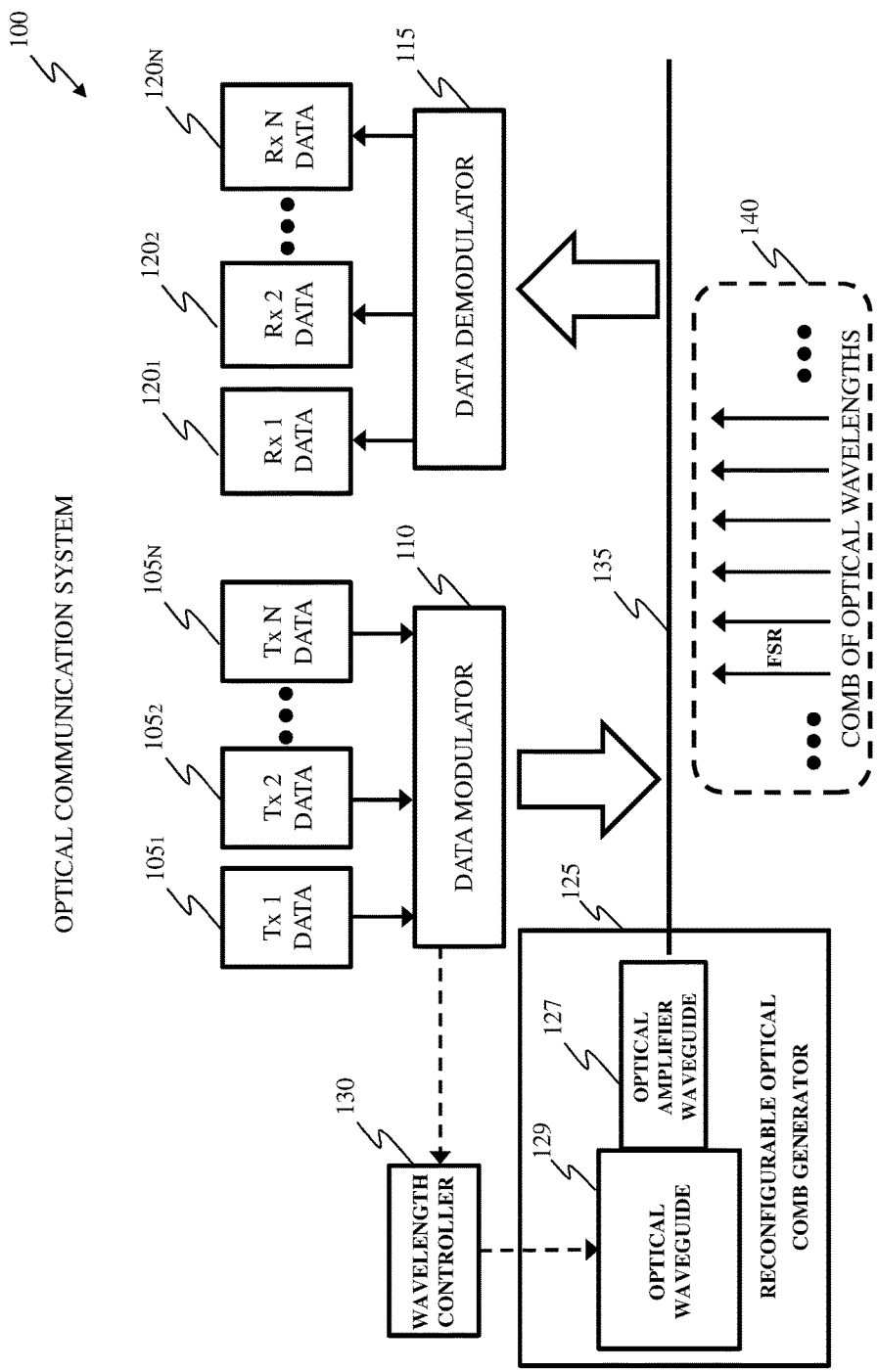
FIG. 1 illustrates an embodiment of an optical communication system constructed according to the principles of the present disclosure.

Herein, various embodiments are described more fully by the Figures and the Detailed Description. Nevertheless, the disclosures of the inventors may be embodied in various forms and are not limited to the embodiments described in the Figures and Detailed Description of Illustrative Embodiments.

DETAILED DESCRIPTION

The description and drawings merely illustrate the principles of the disclosure. It will thus be appreciated that those skilled in the art will be able to devise various arrangements that, although not explicitly described or shown herein, embody the principles of the disclosure and are included within its scope. Furthermore, all examples recited herein are principally intended expressly to be for pedagogical purposes to aid the reader in understanding the principles of the disclosure and concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

Comb sources and multi-frequency lasers are key candidates for enabling low cost wavelength division multiplexing (WDM) networks. The use of such sources introduces a new paradigm in the design of optical transponders. Compared to a conventional transmitter architecture, where one tunable laser is used with one modulator, only one comb source can be used for several modulators. Traditional wavelength division multiplexing transport technologies that use colorless transceivers with multiplexing and demultiplexing are usually too expensive and introduce extra optical losses.

Optical gain material, such as bulk, quantum well, or quantum dot III-V material can be formed into a Fabry-Perot laser on III-V semiconductor. Multiple optical modes may be generated in such an optical cavity that can either be actively mode-locked or passively mode-locked by using a saturable absorber or four-wave mixing. For instance, passive mode locked operation of a self-pulsating QDash Fabry-Perot laser diode at a repetition over 300 GHz has been demonstrated to enhanced four-wave mixing in this material. This type of laser has also been demonstrated in a hybrid III-V silicon platform. Stable combs can be generated where the mode spacing depends on the Fabry-Perot cavity length. However, these lasers suffer from low power output and large linewidth due to the short cavities required.

Hybrid III-V silicon photonic mode-locked lasers have also been demonstrated in a racetrack configuration. In this type of laser, the cavity forms a complete loop in a silicon chip, with the active gain material present in only one part of the cavity. This architecture facilitates implementation of other optical components such as power taps and intra-cavity filters in the laser cavity. However, intra-cavity filters implemented in this way require high-speed radio frequency signal generators and optical modulators to set the mode spacing, or require a fixed filter that cannot be tuned later if the free spectral range needs to be changed. This significantly increases both the cost and complexity of the comb laser.

Embodiments of the present disclosure include a solid state hybrid comb laser that employs III-V semiconductor gain material and silicon photonic integrated circuits in using a sequence of optical ring resonators (i.e., selectable filters) to remove groups of Fabry-Perot spectral wavelengths. This effectively increases the free spectral range of a long-cavity Fabry-Perot comb laser. By tuning the intra-cavity selectable filters in and out of resonance, the free spectral range of the cavity can be digitally tuned to selected free spectral range values.

Additionally, embodiments of this disclosure allow the cavity of such a laser to be much longer than traditional comb lasers, while maintaining wide comb spacing (i.e., increased free spectral range). Narrower laser linewidth and higher laser power are achieved than conventional comb lasers can produce. This achieves a compact integrated solution for an optical tunable comb generator where wavelength on-demand may be provided. Such reconfigurable, multi-wavelength lasers are ultra-compact and provide low energy consumption, since only one active medium is employed. The ring filters typically require low power consumption to be tuned, (e.g., less than 100 mW). Additionally, these devices can fulfill the requirements of fast and reconfigurable wavelength division multiplexing networks at reduced costs.

FIG. 1 illustrates an embodiment of an optical communication system, generally designated 100, constructed according to the principles of the present disclosure. The optical communication system 100 includes data transmitters $105_1$-$105_N$, a data modulator 110, a data demodulator 115, data receivers $120_1$-$120_N$, a reconfigurable optical comb generator 125 and a wavelength controller 130. The reconfigurable optical comb generator 125 includes a semiconductor optical amplifier (SOA) 127, a photonic integrated circuit (PIC) 129 and provides a comb laser beam 135 having a comb of optical wavelengths 140. Although not expressly shown in FIG. 1, the semiconductor optical amplifier 127 includes an optical amplifier waveguide and the photonic integrated circuit 129 includes another optical waveguide, which will be further illustrated in FIG. 2.

In the optical communication system 100, the semiconductor optical amplifier 127 and the photonic integrated circuit 129 are end-coupled together to form the reconfigurable optical comb generator 125, which in turn provides the comb laser beam 135 having the comb of optical wavelengths 140. The data modulator 110 modulates transmission data from the data transmitters $105_1$-$105_N$ into an optical transmission that is multiplexed onto the comb laser beam 135 employing the comb of optical wavelengths 140.

The wavelength controller 130 controls the comb of optical wavelengths 140 based on information received from the data modulator 110 to assure proper modulation and multiplexing of the transmission data. The optical transmission is then conveyed over the comb laser beam 135 to the data demodulator 115, wherein the optical transmission may additionally convey formatting information for the data demodulator 115 (not shown). The data demodulator 115 demodulates and demultiplexes the optical transmission from the comb laser beam 135 to receive the transmission data that is then provided to the data receivers $120_1$-$120_N$. A free spectral range (FSR) of the comb of optical wavelengths 140 is varied to accommodate the optical transmission, as required.

Figure 2:
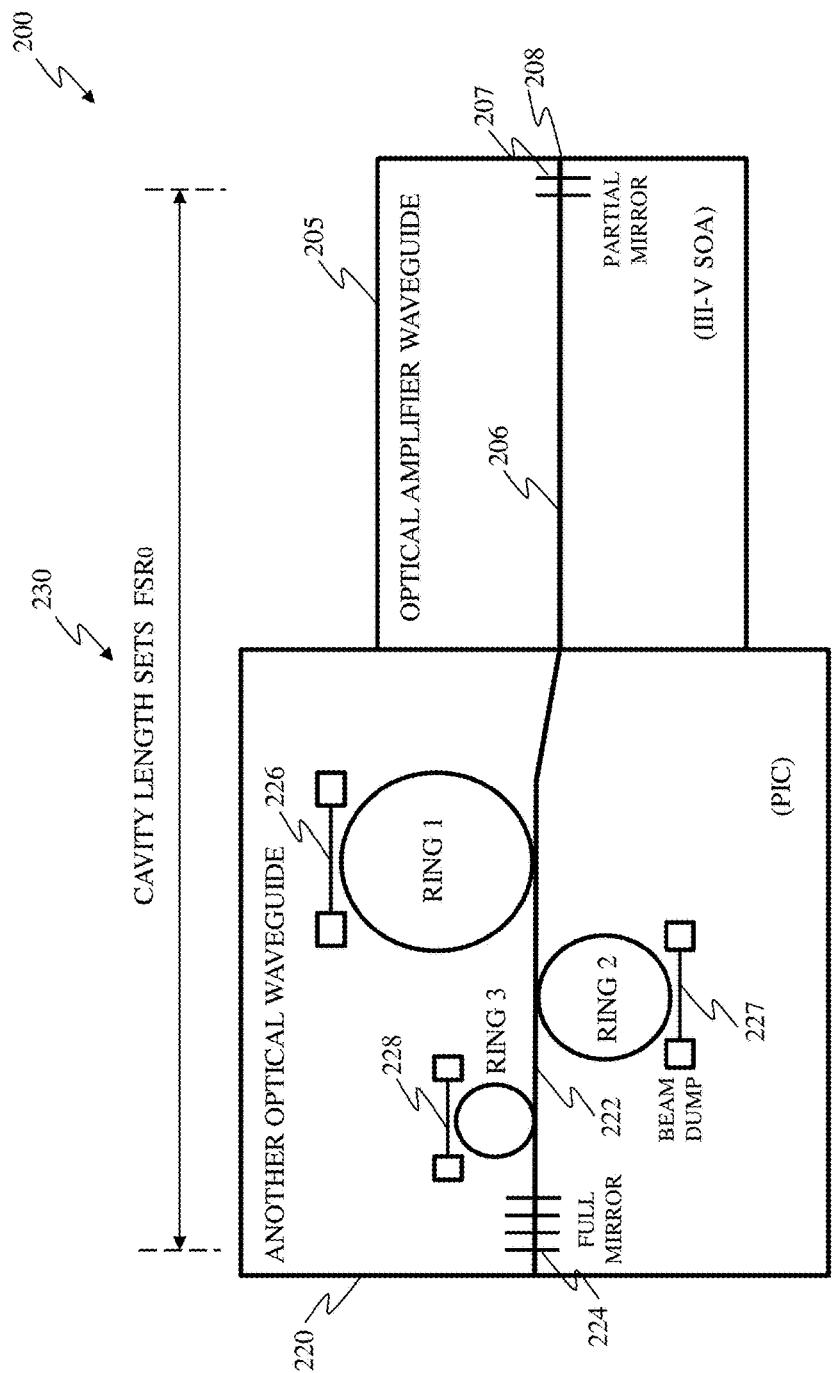
FIG. 2 illustrates an embodiment of a reconfigurable optical comb generator constructed according to the principles of the present disclosure.

FIG. 2 illustrates an embodiment of a reconfigurable optical comb generator, generally designated 200, constructed according to the principles of the present disclosure. The reconfigurable optical comb generator 200 includes a semiconductor optical amplifier (SOA) 205 and a photonic integrated circuit (PIC) 220. The semiconductor optical amplifier 205 includes an optical amplifier waveguide 206, a partial reflectivity mirror 207 and an optical output port 208 that provides a comb laser beam (not shown). The PIC 220 includes another optical waveguide 222, a fully reflecting mirror 224 and first, second and third selectable optical ring resonators (drop ring filters) 226, 227, 228.

Generally, the reconfigurable optical comb generator 200 employs the semiconductor optical amplifier 205 and the PIC 220 to provide an output comb of wavelengths. This combination forms a laser (e.g., silicon photonic) cavity 230 between the partial reflectivity mirror 207 and the fully reflecting mirror 224. The first, second and third selectable optical ring resonators 226, 227, 228 are located within the silicon photonic cavity 230 along the another optical waveguide 222 and employed to modify a free spectral range of the output comb of wavelengths.

In this embodiment, the semiconductor optical amplifier 205 is a quantum-dot III-V compound semiconductor structure that allows passive mode-locking without the use of a saturable absorber. A III-V compound semiconductor may be obtained by combining group III elements (i.e., Al, Ga, In) with group V elements (i.e., N, P, As, Sb). Generally, many different materials may be employed, such as a rare earth (e.g., Erbium) doped waveguide or a II-VI semiconductor, for example. In this embodiment, the quantum-dot III-V semiconductor optical amplifier 205 is optically end-coupled to the PIC 220 to form the silicon photonic cavity 230.

The first, second and third selectable optical ring resonators (drop ring filters) 226, 227, 228 employ beam dump structures that effectively absorb or remove unwanted wavelengths from the output wavelengths of the reconfigurable optical comb generator 200. In some cases, one or more of the optical ring resonators 226, 227, 228 may themselves provide optical losses high enough to inhibit lasing action without having to employ beam dump structures.

In one example, a total length of the silicon photonic cavity 230 is chosen such that the cavity free spectral range ($FSR_0$) is 12.5 GHz. Selection (i.e., activation) of the first selectable optical ring resonator 226 provides output wavelengths having a free spectral range of 25 GHz (2 times $FSR_0$). The added selection of the second selectable optical ring resonator 227 provides output wavelengths having a free spectral range of 50 GHz (4 times $FSR_0$). Finally, the added selection of the third selectable optical ring resonator 228 provides output wavelengths having a free spectral range of 100 GHz (8 times $FSR_0$).

FIGS. 3A, 3C, 3E and 3G are respectively paired with FIGS. 3B, 3D, 3F and 3H to illustrate operating examples of a reconfigurable optical comb generator, such as may be employed in the embodiments of FIGS. 1 and 2 above. FIGS. 3A, 3C, 3E and 3G show Fabry-Perot (FP) modes of the reconfigurable optical comb generator in which FP mode wavelengths in FIG. 3A starting with wavelength 301 are typical. FIGS. 3A, 3C, 3E and 3G also show transfer functions for a set of three selectable (intra-cavity) filters in which transfer functions 305, 307, 309 in FIG. 3A are representative of a deselection of all three filters. FIGS. 3B, 3D, 3F and 3H respectively show output wavelengths of the reconfigurable optical comb generator for four cases of intra-cavity filter selection. In FIGS. 3A-3H, the inter-cavity transfer functions provide either a wavelength pass condition (for deselection of an intra-cavity filter) or a wavelength stop condition (for selection of the intra-cavity filter) for associated FP mode wavelengths.

In FIGS. 3A and 3B, the transfer functions 305, 307, 309 are seen to represent deselection of all three intra-cavity filters, since the transfer functions 305, 307, 309 are in their wavelength pass condition. These transfer conditions thereby provide FP mode output wavelengths having their smallest free spectral range $FSR_0$, as determined by a cavity length of the reconfigurable optical comb generator.

In FIGS. 3C and 3D, the transfer function 310 indicates that its inter-cavity filter has now been selected and shifted into its wavelength stop condition, while the inter-cavity filters corresponding to the transfer functions 307, 309 remain in their wavelength pass condition corresponding to their continued deselection. This operating mode causes every other one of the FP mode wavelengths in FIG. 3C to be removed from the output wavelengths thereby increasing the free spectral range of FIG. 3D output wavelengths to twice that of FIG. 3B (i.e., 2*$FSR_0$), as shown.

In FIGS. 3E and 3F, the transfer functions 310 and 312 indicate that their inter-cavity filters have been selected and shifted into their wavelength stop condition, while the inter-cavity filter corresponding to the transfer function 309 remains in its wavelength pass condition corresponding to its continued deselection. This operating mode causes three out of every four of the FP mode wavelengths in FIG. 3E to be removed from the output wavelengths thereby increasing the free spectral range of FIG. 3F output wavelengths to four times that of FIG. 3B (i.e., 4*$FSR_0$), as shown.

Finally, in FIGS. 3G and 3H, the transfer functions 310, 312 and 314 indicate that their inter-cavity filters have been selected and shifted into their wavelength stop condition. This operating mode causes seven out of every eight of the FP mode wavelengths in FIG. 3G to be removed from the output wavelengths thereby increasing the free spectral range of FIG. 3H output wavelengths to eight times that of FIG. 3B (i.e., 8*$FSR_0$), as shown.

This process allows the reconfigurable optical comb generator to provide comb output waveforms having an eight to one variation in free spectral range that may be digitally step-wise selectable. Additionally, the reconfigurable optical comb generator is able to achieve higher output power with lower wavelength linewidth.

Figure 4:
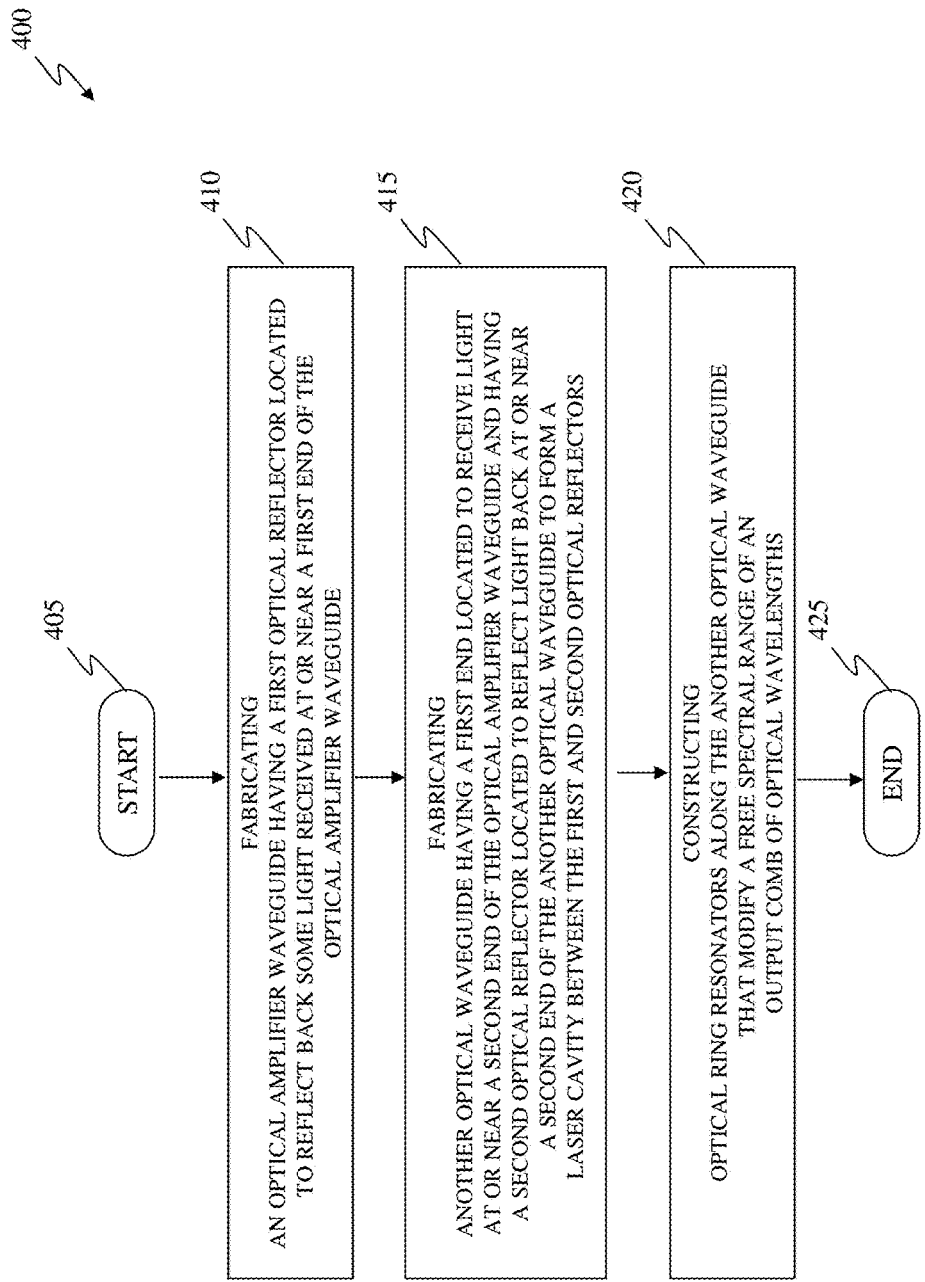
FIG. 4 illustrates a flow diagram of an embodiment of a method of manufacturing a reconfigurable optical comb generator carried out according to the principles of the present disclosure.

FIG. 4 illustrates a flow diagram of an embodiment of a method of manufacturing a reconfigurable optical comb generator, generally designated 400, carried out according to the principles of the present disclosure. The method 400 starts in a step 405. Then, in a step 410, an optical amplifier waveguide is fabricated having a first optical reflector located to reflect back some light received at or near a first end of the optical amplifier waveguide. Another optical waveguide is fabricated having a first end located to receive light at or near a second end of the optical amplifier waveguide and having a second optical reflector located to reflect light back at or near a second end of the another optical waveguide to form a laser cavity between the first and second optical reflectors, in a step 415. Optical ring resonators are constructed along the another optical waveguide that modify a free spectral range of an output comb of optical wavelengths, in a step 420.

In one embodiment, the another optical waveguide and the optical ring resonators form a planar optical waveguide circuit. Correspondingly, first and second ones of the optical ring resonators are configured to have free spectral ranges of about two and about four times a free spectral range of a third one of the optical ring resonators. Additionally, at least one of the optical ring resonators includes a beam dump configuration capable of attenuating light therein.

In another embodiment, at least one of the optical ring resonators is capable of attenuating light in the laser cavity such that the laser cavity does not lase at a resonant wavelength of the at least one optical ring resonator. In yet another embodiment, an electronic controller is configured to control the free spectral ranges of the optical ring resonators. The method 400 ends in a step 425.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Embodiments of this disclosure allow a laser cavity to be much longer than traditional comb lasers while maintaining wide comb spacing, narrower linewidth and higher output power. This can all be accomplished without the need for fixed filters or active radio frequency components. They also provide a compact integrated solution for an optically tunable comb generator, where wavelength on-demand may be provided. Such a reconfigurable, multi-wavelength laser may be ultra-compact and provide low energy consumption, since only one active medium is employed.

Those skilled in the art to which this application relates will appreciate that other and further additions, deletions, substitutions and modifications may be made to the described embodiments.

What is claimed is:

1. An apparatus, comprising:
   an optical amplifier waveguide;
   an optical reflector located to reflect back some light received at or near a first end of the optical amplifier waveguide; and
   another optical waveguide having a first end located to receive light at or near a second end of the optical amplifier waveguide, the another optical waveguide having a sequence of optical ring resonators optically connected there along, each of the optical ring resonators being configured to have a different free spectral range, wherein a first one of the ring resonators is configured to have a free spectral range of about two times a free spectral range of a second one of the ring resonators.

2. The apparatus of claim 1, wherein the another optical waveguide and the ring resonators form a planar optical waveguide circuit.

3. The apparatus of claim 2, wherein the optical amplifier waveguide is located in a semiconductor optical amplifier.

4. The apparatus of claim 1 wherein the optical amplifier waveguide and the another optical waveguide are optically end-coupled.

5. The apparatus of claim 1, further comprising another optical reflector located to reflect light received at or near a second end of the another optical waveguide; and
   wherein at least, one of the optical ring resonators is configured to resonantly couple to the another optical waveguide at a wavelength of an optical mode of an optical cavity terminated by the optical reflectors.

6. The apparatus of claim 1 wherein the optical amplifier waveguide and the another optical waveguide form a part of a laser cavity.

7. The apparatus of claim 6 wherein each of optical ring resonators is capable of attenuating light in the cavity such that the cavity does not lase at a resonant wavelength of the each of the optical ring resonators.

8. The apparatus of claim 1 wherein at least one of the ring resonators includes a beam dump configuration capable of attenuating light therein.

9. The apparatus of claim 1 wherein the first one of the ring resonators is configured to have a free spectral range of about four times a free spectral range of a third one of the ring resonators.

10. The apparatus of claim 1, further comprising an electronic controller configured to electrically control the free spectral ranges of the optical ring resonators.

11. The apparatus of claim 1, wherein the first one of the ring resonators and the second one of the ring resonators are configured to have free spectral ranges of about two times and about four times, respectively, a free spectral range of a third one of the ring resonators.

12. A system, comprising:
    a data modulator to provide transmission data;
    a reconfigurable optical comb generator, having an optical amplifier waveguide and another optical waveguide, the optical comb generator to provide an output comb of optical wavelengths for an optical transmission of the transmission data,
    wherein the optical amplifier waveguide includes an optical reflector located to reflect back some light received at or near a first end of the optical amplifier waveguide, and
    wherein the another optical waveguide includes a first end being located to receive light and optically end-coupled to a second end of the optical amplifier waveguide, the another optical waveguide having a sequence of optical ring resonators optically connected there along, each of the optical ring resonators being configured to have a different free spectral range, wherein a first one of the ring resonators is configured to have a free spectral range of about two times a free spectral range of a second one of the ring resonators.

13. The system of claim 12, further comprising another optical reflector located to reflect light received at or near a second end of the another optical waveguide to form a laser cavity between the optical reflectors.

14. The system of claim 12, further comprising a data demodulator to recover the transmission data from the optical transmission.

15. The system of claim 12 further comprising a wavelength controller to control the free spectral ranges of the optical ring resonators.

16. The system of claim 12, wherein the first one of the ring resonators and the second one of the ring resonators are configured to have free spectral ranges of about two times and about four times, respectively, a free spectral range of a third one of the ring resonators.

17. A method, comprising:
    fabricating an optical amplifier waveguide having a first optical reflector located to reflect back some light received at or near a first end of the optical amplifier waveguide;
    fabricating another optical waveguide having a first end located to receive light at or near a second end of the optical amplifier waveguide and having a second optical reflector located to reflect light back at or near a second end of the another optical waveguide to form a laser cavity between the first and second optical reflectors; and
    constructing optical ring resonators along the another optical waveguide, wherein a first one of the ring resonators is configured to have a free spectral range of about two times a free spectral range of a second one of the ring resonators.

18. The method of claim 17, wherein the another optical waveguide and the optical ring resonators form a planar optical waveguide circuit.

19. The method of claim 17, wherein the first one of the optical ring resonators is configured to have a free spectral range of about four times a free spectral range of a third one of the optical ring resonators.

20. The method of claim 17, wherein at least one of the optical ring resonators includes a beam dump configuration capable of attenuating light therein.

21. The method of claim 17, wherein at least one of the optical ring resonators is capable of attenuating light in the laser cavity such that the laser cavity does not lase at a resonant wavelength of the at least one of the optical ring resonators.

22. The method of claim 17, further comprising providing an electronic controller configured to control the free spectral ranges of the optical ring resonators.

23. The method of claim 17, wherein the first one of the ring resonators and the second one of the ring resonators are configured to have free spectral ranges of about two times and about four times, respectively, a free spectral range of a third one of the ring resonators.

* * * * *